(12) United States Patent
Zhou et al.

(10) Patent No.: US 9,484,202 B1
(45) Date of Patent: Nov. 1, 2016

(54) APPARATUS AND METHODS FOR SPACER DEPOSITION AND SELECTIVE REMOVAL IN AN ADVANCED PATTERNING PROCESS

(71) Applicant: Applied Materials, Inc., Santa Clara, CA (US)

(72) Inventors: Jie Zhou, Sunnyvale, CA (US); Chentsau Ying, Cupertino, CA (US); Shambhu N. Roy, Fremont, CA (US); Srinivas D. Nemani, Sunnyvale, CA (US); Jingjing Liu, Milpitas, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/729,932

(22) Filed: Jun. 3, 2015

(51) Int. Cl.
*H01L 21/302* (2006.01)
*H01L 21/033* (2006.01)
*H01L 21/311* (2006.01)

(52) U.S. Cl.
CPC ....... *H01L 21/0338* (2013.01); *H01L 21/0332* (2013.01); *H01L 21/0335* (2013.01); *H01L 21/0337* (2013.01); *H01L 21/311* (2013.01)

(58) Field of Classification Search
CPC .......... G06F 17/5068; G06F 2217/12; H01L 21/027; H01L 21/31144; H01L 21/311; H01L 21/31105; H01L 21/3116
USPC ....... 438/421, 706, 710, 712, 714, 717, 725, 438/736, 720, 735, 738
See application file for complete search history.

(56) References Cited

U.S. PATENT DOCUMENTS

| 2009/0286402 | A1* | 11/2009 | Xia | H01L 21/0337 438/703 |
| 2012/0052683 | A1* | 3/2012 | Kim | H01L 21/02337 438/694 |
| 2012/0276711 | A1* | 11/2012 | Yoon | H01L 21/764 438/421 |
| 2012/0309194 | A1* | 12/2012 | Xu | H01J 37/32082 438/694 |
| 2013/0122699 | A1* | 5/2013 | Wang | H01L 21/02071 438/585 |
| 2013/0306598 | A1 | 11/2013 | Ko et al. | |
| 2015/0014772 | A1 | 1/2015 | Cheng et al. | |
| 2015/0028459 | A1 | 1/2015 | Liu et al. | |
| 2015/0118850 | A1 | 4/2015 | Peng et al. | |
| 2015/0137204 | A1* | 5/2015 | Wang | H01L 21/32139 257/314 |

FOREIGN PATENT DOCUMENTS

KR 20130027154 A 3/2013

OTHER PUBLICATIONS

International Search Report and Written Opinion for PCT/US2016/033882 dated Jul. 29, 2016.

* cited by examiner

*Primary Examiner* — Lan Vinh
(74) *Attorney, Agent, or Firm* — Patterson & Sheridan, LLP

(57) ABSTRACT

Embodiments herein provide apparatus and methods for performing a deposition and a patterning process on a spacer layer with good profile control in multiple patterning processes. In one embodiment, a method for depositing and patterning a spacer layer during a multiple patterning process includes conformally forming a spacer layer on an outer surface of a patterned structure disposed on a substrate, wherein the patterned structure has a first group of openings defined therebetween, selectively treating a first portion of the spacer layer formed on the substrate without treating a second portion of the spacer layer, and selectively removing the treated first portion of the spacer layer.

18 Claims, 5 Drawing Sheets

APPARATUS AND METHODS FOR SPACER DEPOSITION AND SELECTIVE REMOVAL IN AN ADVANCED PATTERNING PROCESS

BACKGROUND OF THE DISCLOSURE

1. Field

The embodiments herein generally relate to an apparatus and a fabrication process for forming a spacer layer for use in a lithographic multi-patterning fabrication process.

2. Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As circuit densities increase for next generation devices, the width or pitch of interconnects, such as vias, trenches, contacts, devices, gates and other features, as well as the dielectric materials there between, are decreasing to 45 nm and 32 nm dimensions and beyond. As device scaling was extended to further below the resolution limit of the lithography scanners, multi-patterning was employed to enable meeting the feature density requirements of today's integrated devices. Multi-patterning is a process of performing several resist coating, lithographic patterning, and etching operations to ultimately pattern a film layer in multiple steps. When combined, the overlapping pattern operations form the features in an underlying hardmask layer, which when fully patterned, may be used to pattern an underlying layer, or serve as an implant or diffusion mask.

In one example, multiple patterning processes are widely employed in forming small features in a hardmask layer. Self-aligned double patterning (SADP) is a double patterning process used for extending the capabilities of photolithographic techniques beyond the minimum pitch. FIG. 1A-1D depict an example of a conventional prior art cycle 100 for a self-aligned double patterning (SADP) or self-aligned triple patterning (SATP) or even self-aligned quadruple patterning (SAQP) used to etch a hardmask layer. The conventional cycle 100 is depicted in snapshots from FIG. 1A to FIG. 10, which are depictions of the same portions of the substrate as processing thereof progresses. In the example, a low-K layer 103 is disposed on a substrate 101. A hardmask layer 105 may be disposed on the low-K layer 103 with a patterned structure 108 (e.g., a structure patterned formed by a dielectric layer, a photoresist layer or any suitable materials for patterning) formed thereover, defining openings 118 therein. It is noted that between the patterned structure 108 and the hardmask layer 105, additional sacrificial layers may be formed to assist patterning the underlying layers. In FIG. 1B, a spacer layer 126 may be formed conformally on sidewalls 111 and a top surface 109 of the patterning structure 108 to further reduce dimensions of the opening 118 (in FIG. 1A) to openings 125. In FIG. 1C, an etching process is performed to etch a portion of the spacer layer 126 from the substrate 101 until the top surface 109 of the patterned structure 108 is exposed and a surface of the underlying hardmask layer 105 is exposed. In FIG. 1D, a final etching process is performed to remove the patterned structure 108 from the substrate 101, leaving the spacer layer 126 defining new openings 145 with reduced dimensions in the spacer layer 116 on the substrate 101. After the hardmask layer 105 is further patterned using the patterned spacer layer 126 as an etching mask, a self-aligned double patterning (SADP) is then considered completed. In some cases, the process may be continued to form an additional spacer layer to further narrow down the dimension of the openings 145 to even narrower openings as needed. It is noted that numbers of the spacer layers may be formed as many as desired as long as the openings defined in between does not close-up and spacer layers apart defined by the openings.

During etching of the spacer layer 126 in FIG. 1C, different etching rates for different materials (e.g., patterned structures 108, the spacer layer 126 and the underlying hardmask layer 105) on the substrate 101 may result in different etching dimensions or asymmetric etching profile formed at different places of the resultant structure. In particular, after the etching process, the corners 132 of the spacer layer 126, as indicated in the circle 130, often suffer from rounded top shoulder erosion, shoulder faceting or undesired non-vertical sidewall etched profile, resulting in critical dimension (CD) loss or deformed profiles. Inaccurate critical dimension or profile deformation of the patterned structure may cause a light beam out-of focus issues, overlay errors and a significant resolution loss during the subsequent lithography exposure process. In some cases, inaccurate profile or structural dimensions may result in collapse of the device structure, eventually leading to device failure and product low yield.

Therefore, there is a need for an improved method for accurate profile control during a multi-patterned process.

SUMMARY

Embodiments herein provide apparatus and methods for forming a spacer layer and in-situ performing a selective removal process on the spacer layer with good profile control in multiple patterning processes to form nanowires for semiconductor applications. In one embodiment, a method for depositing and patterning a spacer layer during a multiple patterning process includes conformally forming a spacer layer on an outer surface of a patterned structure disposed on a substrate, wherein the patterned structure has a first group of openings defined therebetween, selectively treating a first portion of the spacer layer formed on the substrate without treating a second portion of the spacer layer, and selectively removing the treated first portion of the spacer layer.

In another embodiment, a method for depositing and patterning a spacer layer during a multiple patterning process includes performing a pre-treating process on a substrate provided in a processing chamber, performing a spacer layer deposition process to form a spacer layer on the substrate by using an inductive coupled plasma during the deposition process, performing a post-deposition treatment process to selective treat a portion of the spacer layer by using a RF bias power without the inductive coupled plasma during the post-deposition treatment process, and performing a selective removal process to selective remove the portion of the spacer layer by a remote plasma source during the selective removal process.

In yet another embodiment, a method for forming and patterning a spacer layer during a multiple patterning process includes a method for depositing and patterning a spacer layer disposed on a substrate includes supplying a deposition gas mixture including a silicon-based gas and a nitrogen into a processing chamber to depositing a spacer layer on a substrate using an inductive coupled plasma formed in the deposition gas mixture, supplying a post-deposition treatment gas mixture including an inert gas to selective treat a first portion of the spacer layer disposed on the substrate without treating a second portion of the spacer layer, and supplying a selective removal gas mixture to remove only the treated first portion of the spacer layer from the substrate using a remote plasma source formed from the selective removal gas mixture.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
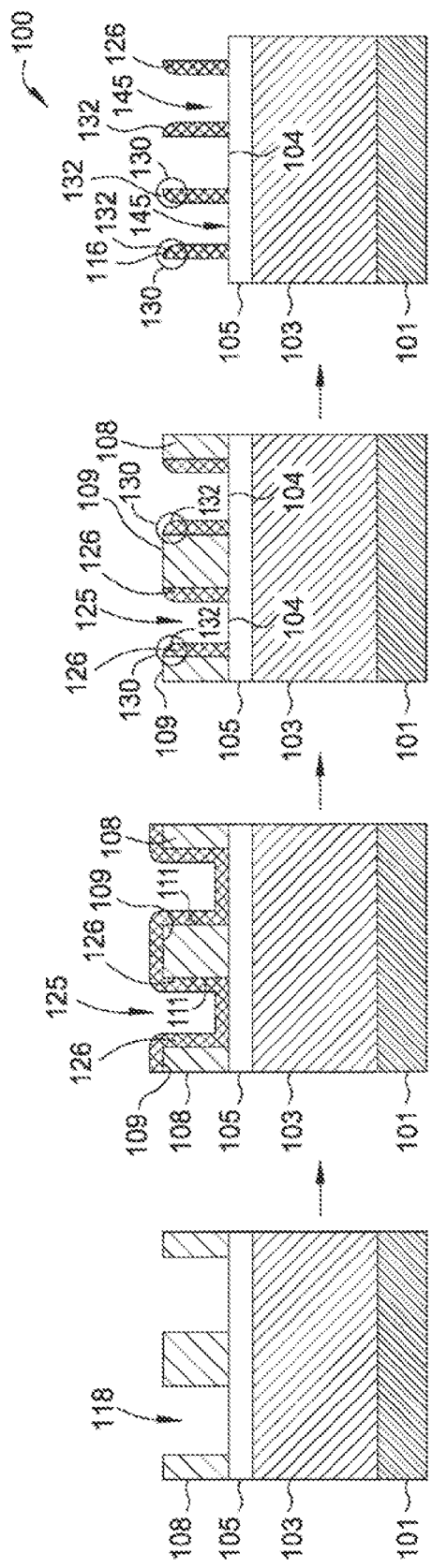
FIGS. 1A-1D depict a conventional cycle for multi-patterning process that utilizes a spacer layer to reduce dimensions of openings.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present application includes a process to deposit and pattern a spacer layer utilized in a multi-patterning process which may provide a patterned spacer layer with desired accurate dimension and profile without rounded, deformed or eroded corners and/or shoulders. The spacer layer may be utilized in a multiple patterning process which may be ultimately used to pattern and etch a dielectric interconnect material for the formation of metal containing features (e.g., nano wires) with high aspect ratios and/or with small dimensions. In one embodiment, the spacer layer deposition and patterning process may include a deposition process that forms a spacer layer followed by a selective removal process to efficiently shape and control the resultant profile to provide a spacer layer with desired profile and dimension. The deposition and selective removal process may be performed by utilizing an inductive couple plasma source (ICP) deposition process and then followed by a selective removal process utilizing a remote plasma source. The inductive couple plasma source (ICP) deposition process and the remote plasma source selective removal process may be in-situ performed in an apparatus equipped with both ICP source and RPS source that provides the desired capability to perform both the deposition process and the selective removal process. As such, a controlled deposition and selective removal process with desired film profile may be obtained in the spacer layer after the spacer layer is formed and patterned.

Figure 2:
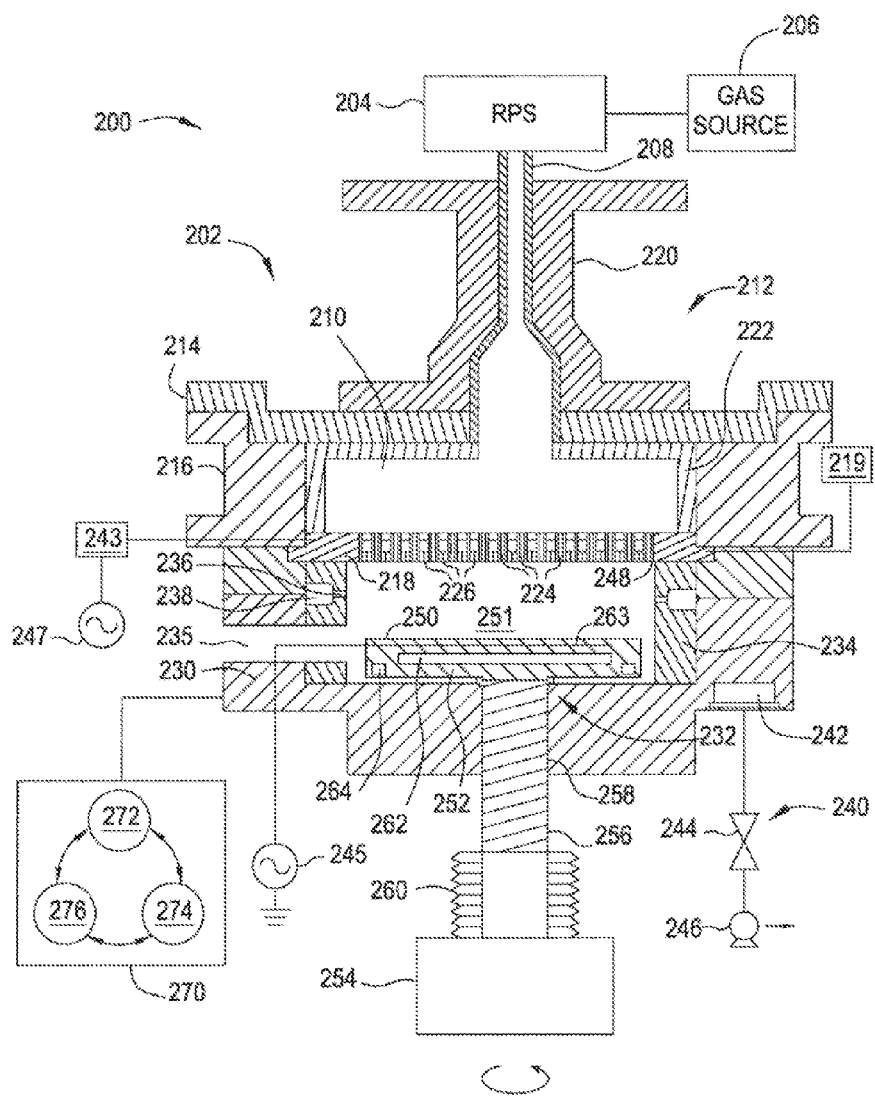
FIG. 2 depicts a processing chamber that may be utilized to form a spacer layer and perform a selective removal process.

FIG. 2 is a cross-sectional view of an apparatus 200 for performing a deposition process to form a spacer layer followed by a selective removal process. Suitable processing chambers that may be adapted for use with the teachings disclosed herein include, for example, an HDP-Producer® or C3® processing chamber available from Applied Materials, Inc. of Santa Clara, Calif. Although the apparatus 200 is shown including a plurality of features that enable superior deposition and selective removal performance, it is contemplated that other processing chambers may be adapted to benefit from one or more of the inventive features disclosed herein.

The apparatus 200 includes a processing chamber 202 and a remote plasma source 204 coupled to the processing chamber 202. The remote plasma source 204 may be any suitable source that is capable of generating radicals. The remote plasma source 204 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. The remote plasma source 204 may include one or more gas sources 206 and the remote plasma source 204 may be coupled to the processing chamber 202 by a radical conduit 208. One or more process gases, which may be radical-forming gases, may enter the remote plasma source 204 via the one or more gas sources 206. The one or more process gases may comprise an chlorine-containing gas, fluorine containing gas, inert gas, oxygen-containing gas, a nitrogen-containing gas, a hydrogen containing gas, or any combination thereof. Radicals generated in the remote plasma source 204 travel into the processing chamber 202 through the radical conduit 208 coupling to the processing chamber 202, reaching an interior processing region 251 defined in the processing chamber 202.

The radical conduit 208 is a part of a lid assembly 212, which also includes a radical cavity 210, a top plate 214, a lid rim 216, and a showerhead 218. The radical conduit 208 may comprise a material that is substantially nonreactive to radicals. For example, radical conduit 208 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. A representative example of a suitable $SiO_2$ material is quartz. The radical conduit 208 may be disposed within and supported by a radical conduit support member 220. The radical conduit support member 220 may be disposed on the top plate 214, which rests on the lid rim 216.

The radical cavity 210 is positioned below and coupled to the radical conduit 208, and the radicals generated in the remote plasma source 204 travel to the radical cavity 210 through the radical conduit 208. The radical cavity 210 is defined by the top plate 214, the lid rim 216 and the showerhead 218. Optionally, the radical cavity 210 may include a liner 222. The liner 222 may cover surfaces of the top plate 214 and the lid rim 216 that are exposed to the radical cavity 210. Radicals from the remote plasma source 204 pass through a plurality of tubes 224 disposed in the showerhead 218 to enter into an interior processing region 251. The showerhead 218 further includes a plurality of openings 226 that are smaller in diameter than the plurality of tubes 224. The plurality of openings 226 are connected to an internal volume (not shown) that is not in fluid communication with the plurality of tubes 224. One or more fluid sources 219 may be coupled to the showerhead 218 for introducing a fluid mixture into an interior processing region 251 of the processing chamber 202. The fluid mixture may include precursor, porogen, and/or carrier fluids. The fluid mixture may be a mixture of gases and liquids.

The processing chamber 202 may include the lid assembly 212, a chamber body 230 and a support assembly 232. The support assembly 232 may be at least partially disposed within the chamber body 230. The chamber body 230 may include a slit valve 235 to provide access to the interior of the processing chamber 202. The chamber body 230 may include a liner 234 that covers the interior surfaces of the chamber body 230. The liner 234 may include one or more apertures 236 and a pumping channel 238 formed therein that is in fluid communication with a vacuum system 240. The apertures 236 provide a flow path for gases into the pumping channel 238, which provides an egress for the gases within the processing chamber 202.

The vacuum system 240 may include a vacuum port 242, a valve 244 and a vacuum pump 246. The vacuum pump 246 is in fluid communication with the pumping channel 238 via the vacuum port 242. The apertures 236 allow the pumping channel 238 to be in fluid communication with the interior processing region 251 within the chamber body 230. The interior processing region 251 is defined by a lower surface 248 of the showerhead 218 and an upper surface 250 of the support assembly 232, and the interior processing region 251 is surrounded by the liner 234.

The support assembly 232 may include a support member 252 to support a substrate (not shown) for processing within the chamber body 230. The substrate may be any standard wafer size, such as, for example, 300 mm. Alternatively, the substrate may be larger than 300 mm, such as 450 mm or larger. The support member 252 may comprise aluminum nitride (AlN) or aluminum, depending on operating temperature. The support member 252 may be configured to chuck the substrate to the support member 252. For example, the support member 252 may be an electrostatic chuck or a vacuum chuck.

The support member 252 may be coupled to a lift mechanism 254 through a shaft 256 which extends through a centrally-located opening 258 formed in a bottom surface of the chamber body 230. The lift mechanism 254 may be flexibly sealed to the chamber body 230 by bellows 260 that prevents vacuum leakage from around the shaft 256. The lift mechanism 254 allows the support member 252 to be moved vertically within the chamber body 230 between a process position and a lower, transfer position. The transfer position is slightly below the opening of the slit valve 235. During operation, the spacing between the substrate and the showerhead 218 may be minimized in order to maximize radical flux at the substrate surface. For example, the spacing may be between about 100 mm and about 5,000 mm. The lift mechanism 254 may be capable of rotating the shaft 256, which in turn rotates the support member 252, causing the substrate disposed on the support member 252 to be rotated during operation.

One or more heating elements 262 and a cooling channel 264 may be embedded in the support member 252. The heating elements 262 and cooling channel 264 may be used to control the temperature of the substrate during operation. The heating elements 262 may be any suitable heating elements, such as one or more resistive heating elements.

The heating elements 262 may be connected to one or more power sources (not shown). The heating elements 262 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 264 to cool the substrate. The support member 252 may further include gas passages extending to the upper surface 250 for flowing a cooling gas to the backside of the substrate.

A RF source power 243 may be coupled to the showerhead 218 through a RF source power matching box 247. The RF source power 243 may be low frequency, high frequency, or very high frequency. In one embodiment, the RF source power 243 is a high frequency RF generator that may generate high density plasma for deposit high density film layers. In one example, the RF source power 243 may serve as an inductively coupled RF energy transmitting device that can generate and control the inductive coupled plasma (ICP) generated in the interior processing region 251 above the support member 252. Dynamic impedance matching from the RF source power matching box 247 may be provided when generating the inductive coupled plasma (ICP).

In addition to the RF source power 243, a RF bias power source 245 may be coupled to the support member 252. The support member 252 is configured as a cathode and includes an electrode 263 that is coupled to the RF bias power source 245. The RF bias power source 245 is coupled between the electrode 263 disposed in the support member 252 and another electrode, such as the showerhead 218 or ceiling (top plate 214) of the chamber body 230. The RF bias power generated from the RF bias power source 245 excites and sustains a plasma discharge formed from the gases disposed in the interior processing region 251 of the chamber body 230.

In one mode of operation, the substrate 101 is disposed on the support member 252 in the processing chamber 202. A process gas and/or gas mixture is introduced into the chamber body 230 through the showerhead 218 from the gas sources 206. The vacuum pump 246 maintains the pressure inside the chamber body 230 while removing deposition by-products.

A controller 270 is coupled to the processing chamber 202 to control operation of the processing chamber 202. The controller 270 includes a central processing unit (CPU) 272, a memory 274, and a support circuit 276 utilized to control the process sequence and regulate the gas flows from the gas sources 206. The CPU 272 may be any form of general purpose computer processor that may be used in an industrial setting. The software routines can be stored in the memory 274, such as random access memory, read only memory, floppy, or hard disk drive, or other form of digital storage. The support circuit 276 is conventionally coupled to the CPU 272 and may include cache, clock circuits, input/output systems, power supplies, and the like. Bi-directional communications between the controller 270 and the various components of the processing chamber 202 are handled through numerous signal cables.

Figure 3:
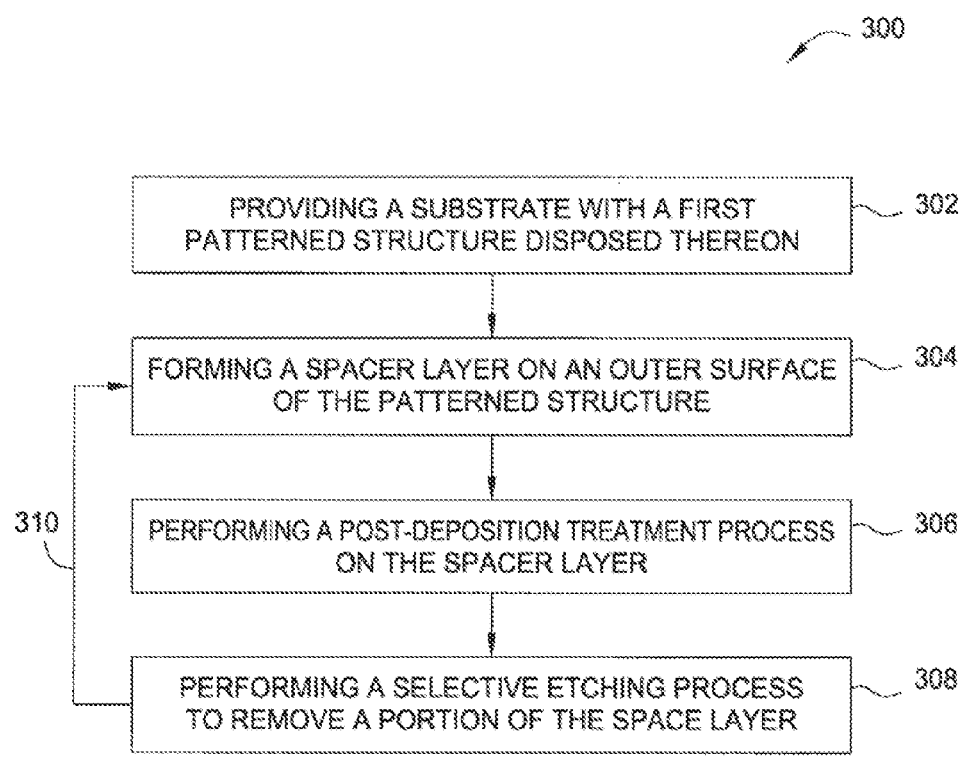
FIG. 3 depicts a flow diagram for performing a spacer layer deposition and patterning process.

FIG. 3 illustrates a method 300 for depositing and patterning a spacer layer on a substrate, which may be later utilized to form a patterning structure during a multiple patterning process for semiconductor devices. FIGS. 4A-4E are cross-sectional views of a portion of a substrate 402 with corresponding to various stages of the method 300. In one example, a spacer layer may be utilized to reduce dimensions of openings formed in patterned structures on a substrate surface during/in a multiple patterning process. Alternatively, the method 300 may be beneficially utilized to etch or remove residuals for other types of structures.

Figure 4A:
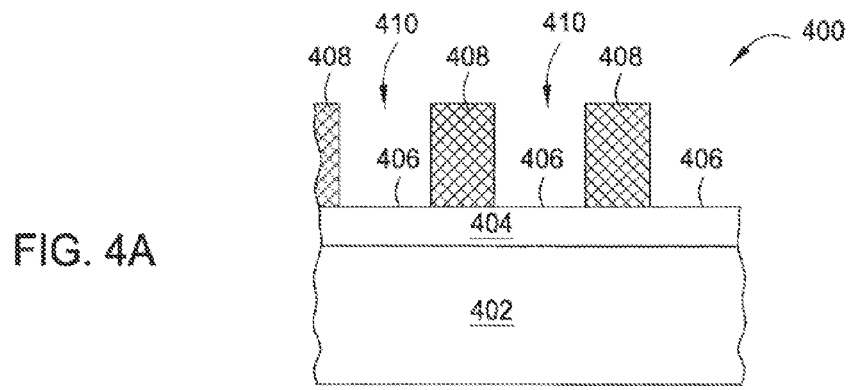
FIGS. 4A-4E depict a film stack at various stages during a multiple patterning process to deposit and pattern a spacer layer on a substrate utilizing the process depicted in FIG. 3.

The method 300 begins at operation 302 by providing a substrate, such as the substrate 402 depicted in FIG. 4A, having a film stack 400 formed thereon, as shown in FIG. 4A. The substrate 402 may be transferred into a processing chamber, such as the processing chamber 202 depicted in FIG. 2 for depositing and patterning a spacer layer. The substrate 402 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 402 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 400 includes at least a dielectric layer 404 disposed on the substrate 402, which may be later utilized to form another patterned structure to facilitate transferring features into the substrate 402. In the embodiment shown in FIG. 4A, the dielectric layer 404 is formed on the substrate 402. It is noted that the dielectric layer 404 may be formed in direct contact or indirect contact (e.g., with additional layers or structures formed between the dielectric layer 404 and the substrate 402) as needed.

In one embodiment, the dielectric layer 404 is silicon oxide, silicon nitride, silicon oxynitride, high-k material, or combinations thereof and the like. The high-k materials referred herein are dielectric materials having dielectric constants greater than 4.0. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In the embodiment depicted in FIG. 4A, the dielectric layer 404 is a silicon oxide layer having a thickness between about 10 nm and about 300 nm.

A patterned structure 408 with a plurality of openings 410 (e.g., a first group of openings) formed therein may be disposed on the dielectric layer 404, exposing a portion 406 of the dielectric layer 404 to facilitate transferring features into the dielectric layer 404 so as to form a desired semiconductor structure in the film stack 400 disposed on the substrate 402 as desired. The patterned structure 408 may be a single layer or a composite layer as needed. In one embodiment, the patterned structure 408 may be fabricated from a silicon containing material, such as polysilicon, crystalline silicon, amorphous silicon, doped silicon materials, amorphous carbon material, silicon nitride, silicon dioxide silicon carbide, or any suitable silicon containing material. In one particular example, the patterned structure 408 is fabricated from an amorphous silicon layer or a polysilicon layer.

Figure 4B:
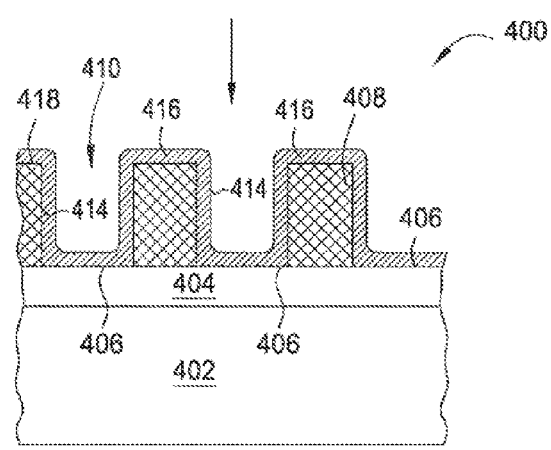

At operation 304, a spacer layer 416 is conformally formed on sidewalls 415 and upper surfaces 418 of the patterned structure 408 as well as the portion 406 of the dielectric layer 404, as shown in FIG. 4B. The spacer layer 416 is formed in the plasma processing chamber, such as the processing chamber 202 depicted in FIG. 2. The spacer layer 416 may be a dielectric material different from the materials selected for the dielectric layer 404. In one example, the spacer layer 416 is a silicon containing layer, such as a polysilicon layer, microcrystalline silicon layer, nanocrystalline layer, amorphous silicon layer and the like. The spacer layer 416 may be formed by a HDP-CVD process, an epitaxial deposition process, a furnace process, an ALD process or any suitable deposition techniques in a PVD, CVD, ALD, or other suitable plasma processing chambers. In one particular example, the spacer layer 416 is an amorphous silicon layer (a-Si) formed by a high density plasma (HDP) CVD process performed in the processing chamber 202 having a thickness between about 7 nm and about 25 nm. Suitable exemplary materials for the spacer layer 416 includes amorphous silicon, polysilicon, amorphous carbon material, silicon nitride, silicon dioxide or silicon carbide.

In one example, during deposition of the spacer layer 416, a deposition gas mixture may be supplied into the processing chamber 202 for processing. In one embodiment, the gas mixture may include at least a silane-based gas. Suitable examples of the silane-based gas include silane ($SiH_4$), di-silane ($Si_2He$), silicon tetrafluoride ($SiF_4$), silicon tetrachloride ($SiCl_4$), and dichlorosilane ($SiH_2Cl_2$), and the like.

In some examples, a carrier gas may also be supplied into the gas mixture during deposition. Suitable examples of the carrier gas include $N_2$, $N_2O$, $NO_2$, $NH_3$, CO, $CO_2$, $O_2$, $O_3$, $H_2O$ and the like. Optionally, an inert gas, such as He, Ar, Kr, Ne or the like, may also be supplied in the gas mixture. In one particular example, the silane-based gas used in the gas mixture is silane ($SiH_4$) or di-silane ($Si_2He$) and the carrier gas is $N_2$ and the inert gas is He to form an amorphous silicon (a-Si) layer or a silicon nitride layer.

In one example, the gas ratio of the silane-based gas to $N_2$ gas is maintained to control reaction behavior of the gas mixture to produce a desired film property. In one embodiment, the gas ratio of the silane-based gas and $N_2$ gas may be controlled at between about 1:3 and about 1:5.

During deposition, a RF source power, such as an inductive coupled plasma (ICP) power may be utilized to deposit the spacer layer 416. The RF source power, i.e., the ICP power, utilized to deposit the spacer layer 416 may assist forming the spacer layer 416 with desired film property, such as a desired density or stress with desired etching rate. In one example, the relatively low RF source power, such as less than 650 Watts, such as between about 200 watts and about 600 watts, for example about 500 Watts, may be supplied to the processing chamber 202 during deposition. A relatively low RF bias power, such as about less than 600 Watts, between 100 Watts and about 500 Watts may also be supplied into the processing chamber 202 during deposition. It is believed that utilizing a relatively lower RF source power with an inductive coupled plasma (ICP) power, such as less than 650 Watts, along with a relatively low RF bias power during the deposition process may provide lower plasma density as well as lower ion bombardment that may enhance dissociation of the ions from the gas mixture. However, excess silicon elements cramped into each lattice unit not only increases film density, but also adversely results in high stress which may provide good film etching/eroding resistance during the following patterning process.

During deposition, the substrate temperature may be controlled between about 200 degrees Celsius and about 450 degrees Celsius, such as about 350 degrees Celsius. The silane-based gas, such as silane (SiH), may be supplied in the gas mixture at a rate between about 8 sccm and about 60 sccm, such as between about 30 sccm and about 40 sccm. The inert gas, such as He gas, may be supplied in the gas mixture at a rate between about 200 sccm and about 2000 sccm, such as about 600 sccm and about 1200 sccm. The carrier gas, such as $N_2$ gas, may be supplied in the gas mixture at a rate between about 60 sccm and about 200 sccm, such as about 120 sccm and about 160 sccm. A RF source power of between about 400 Watts to about 2000 Watts, such as 450 Watts to about 1000 Watts may be applied to maintain a plasma formed from the gas mixture. The process pressure may be maintained at about 5 mTorr to about 100 mTorr, such as about 15 mTorr and about 50 mTorr. The spacing between the substrate and showerhead may be controlled at about 200 mils to about 6000 mils. The deposition process may be performed between about 2 seconds and about 100 seconds, such as about 5 seconds and about 10 seconds.

Additionally, prior to depositing the spacer layer 416 on the substrate 402, a substrate pre-treatment process may be performed prior to the deposition process performed at operation 304. The pre-treatment process may be performed in-situ in the same processing chamber, such as the processing chamber 202, where the deposition process at operation 304 is performed. The pretreatment process and the deposition process at operation 304 may be all regulated and arranged in one single recipe stored in the controller 270 for processing. Alternatively, the pretreatment process and the deposition process at operation 304 may be stored in different recipes and performed consecutively without break as needed.

During the pretreatment process, the substrate 402 may be pre-heated to a desired temperature range by heating the support member 252 upon which the substrate 402 is positioned. In one embodiment, the substrate temperature may be controlled from around 25 degrees Celsius, i.e., the room temperature, to between about 200 degrees Celsius and about 450 degrees Celsius, such as about 350 degrees Celsius. A RF source power, such as the ICP source power, may be applied during the pretreatment process. The RF source power may be supplied to have a top source power of between about 1500 Watts and about 2500 Watts, such as about 2000 Watts, to the processing chamber and a side source power of between about 3000 Watts and about 5000 Watts, such as about 4000 Watts. A process pressure between about 5 mTorr and about 15 mTorr may be maintained during the pretreatment process. A pretreatment gas mixture includes at least an inert gas, such as Ar, He, Ne, or Kr, may be supplied during the pretreatment process. In one example, the pretreatment gas mixture may include an Ar gas and a He gas supplying at a ratio between about 5:1 and about 1:5, such as between about 1:1 and about 1:2 to the processing chamber during the pretreatment process. The pretreatment process may be performed for between about 30 seconds and about 90 seconds, such as about 50 seconds.

Figure 4C:
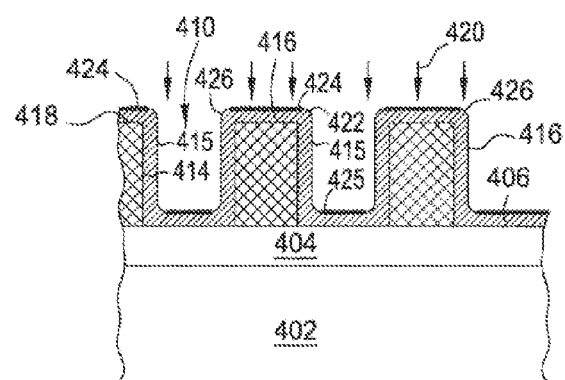

At operation 306, a post-deposition treatment process is performed to selectively treat certain portions of the spacer layer. It is believed that with controlled trajectory and directionality of the ions from the plasma generated during the post deposition treatment process, a controlled treatment contribution may be obtained so as to efficiently carve the spacer layer 416 in a manner that would yield a desired resultant film profile. In one embodiment, the post-deposition treatment process as performed during operation 306 may predominately form a treated layer particularly on the top surface 424 and the bottom surface 425 of the spacer layer 416, as shown in FIG. 4C. As a result, the active treatment species from the plasma may selectively treat only certain portions, e.g., the top surface 424 or the bottom surface 425, of the spacer layer 416, without significantly attacking, eroding, or damaging other portions, e.g., the corners 422 and sidewalls 415, of the spacer layer 416, so as to obtain a good profile of the spacer layer 416 after the treatment process. By doing so, the likelihood of rounded corners, facet corners, eroded sidewalls, or deformed profile formed on the spacer layer 416 may be efficiently reduced or eliminated.

The ions/radicals provided from the plasma generated in the post-deposition treatment process at operation 306 change and/or modify part of the film properties of the spacer layer 416, particularly at the top surface 424 or the bottom surface 425, so as to result in film bonding structures of the treated regions, e.g., the top surface 424 or the bottom surface 425, being different than other regions, such as sidewalls 415 and corners 422 of the spacer layer 416. Dissimilarity in film properties among treated regions (e.g., the top surface 424 or the bottom surface 425) and untreated regions (e.g., the sidewalls 415 and the corners 422) may provide a nature etching barrier between the treated region and other materials remaining from spacer layer 416, thus, providing high selectivity during the operation in the subsequent selective removal process.

The post-deposition treatment process may alter the bonding structure to form the treated regions, such as top surface 424 or the bottom surface 425, to form desired profile/film bonding structure change as needed, providing the treated regions, such as top surface 424 or the bottom surface 425, with altered film properties that enable obtaining different process results during the subsequent selective removal process.

As the power applied to the plasma during the post-deposition treatment process at operation 306 may provide momentum to the atoms from the post-deposition treatment gas mixture, such as an inert gas, so when colliding with the atoms from the top surface 424 or the bottom surface 425, the bonding structures in the top surface 424 or the bottom surface 425 may be damaged and rearranged, thus resulting a damaged/loose bonding structures to the areas selected to be treated, as compared to the untreated regions, such as the sidewalls 415 and the corners 422 of the spacer layer 416. As the atoms from the inert gas damage and loosen the bonding structures present in the top surface 424 or the bottom surface 425, the top surface 424 or the bottom surface 425 after treatment may have a damaged bonding structure, which may be easily removed away by a removal process.

In one example, the post-deposition treatment gas mixture may be supplied during the post-deposition treatment process at operation 306. The post-deposition treatment gas mixture may include at least an inert gas, such as Ar, Ne, He, or Kr, and/or $H_2$ gas with a controlled directionality (e.g., controlled by directional bias power) to perform the post-deposition treatment process. As atoms from the inert gas may provide a desired collision power to strike the top surface 424 or the bottom surface 425 of the spacer layer 416 so as to provide an efficient collision to alter and damage the lattice/bonding structure of the top surface 424 or the bottom surface 425 of the spacer layer 416 to facilitate the following selective removal process performed at operation 306.

Several process parameters may be controlled during the post-deposition treatment process at operation 306. The inert gas, such as He gas, may be supplied into the processing chamber at a flow rate between about 200 sccm and about 1200 sccm. The chamber pressure is generally maintained between about 10 mTorr and about 100 mTorr, for example between about 20 mTorr. The substrate temperature may be controlled between about 100 degrees Celsius and about 450 degrees Celsius, such as about 350 degrees Celsius. A RF bias power, such as capacitive or inductive RF power, DC power, electromagnetic energy, or magnetron sputtering, may be supplied into the processing chamber 202 to assist dissociating the post-deposition treatment gas mixture during processing. Ions generated by the dissociative energy may be accelerated toward the substrate using an electric field produced by applying the RF bias power to the support member 252. In one embodiment, a RF bias power with a frequency of about 13.56 MHz is provided to bias the support member 252 at a power level between about 50 W and about 1500 Watts, such as about 100 Watts. The ions thus produced will generally be accelerated toward the substrate at the desired region, such as the top surface 424 and the bottom surface 425, by biasing the substrate or a gas distributor as described above. In one embodiment, the RF source power may be optionally applied to the processing chamber 202 during the post-deposition treatment process at operation 306. In one particular example, the RF bias power is controlled at about 100 Watts without RF source power applied.

Figure 4D:
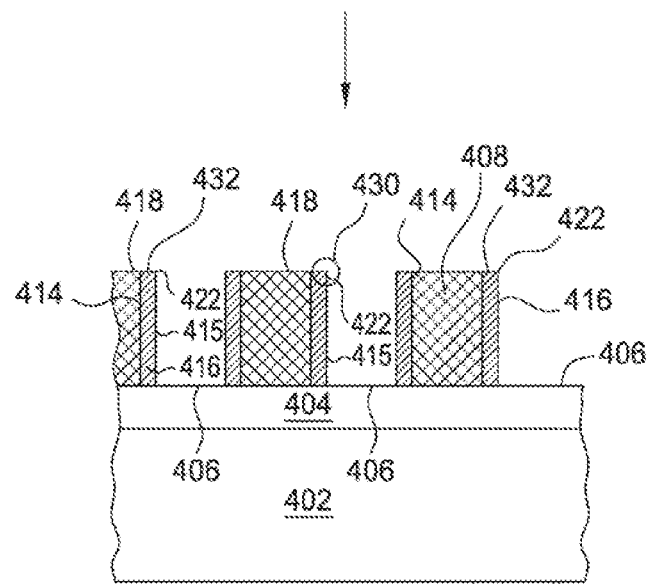

At operation 308, a residual removal process is then performed to remove the treated regions, such as the top surface 424 and the bottom surface 425, from the substrate 402, as shown in FIG. 4D, forming the spacer layer 416 with desired profile and dimension. The removal gas mixture is supplied into a processing chamber with a remote plasma source, such as the remote plasma source 204 in the processing chamber 202 depicted in FIG. 2, to remove the treated regions, such as the top surface 424 and the bottom surface 425, until the upper surfaces 418 of the patterned structure 408 and the portion 406 of the dielectric layer 404 are exposed. As discussed above, the treated regions, such as the top surface 424 and the bottom surface 425, have different film properties, as compared with the sidewalls 415 and corners 422 of the spacer layer 416, serving as an etching barrier layer during the removal process with high selectivity so as only to selectively remove the treated regions, such as the top surface 424 and the bottom surface 425, without damaging or attacking the sidewalls 415 and corners 422 of the spacer layer 416.

The removal gas mixture selected to remove the treated region, such as the top surface 424 and the bottom surface 425, includes a gas mixture supplied from the remote plasma source to remove the top surface 424 and the bottom surface 425 from the substrate 402. The remote plasma removal process is a gentle removal process performed to slowly and selectively remove the top surface 424 and the bottom surface 425 on the substrate 402 substantially without attacking the other surfaces. The remote plasma removal process is performed by supplying a removal gas mixture into the processing chamber 202 to form a remote plasma from the removal gas mixture.

In one embodiment, the removal gas mixture used to remove the treated regions, such as the top surface 424 and the bottom surface 425, is a gas mixture of ammonia ($NH_3$) gas and nitrogen trifluoride ($NF_3$) gas. The ammonia ($NH_3$) gas used in the removal gas mixture may be replaced with $N_2$ gas as needed. Additionally gases, such as $H_2$, Ar, He, may also be added to the removal gas mixture to improve the removal efficiency. The amount of each gas introduced into the processing chamber may be varied and adjusted to accommodate, for example, the thickness of the spacer layer 416 to be removed, the geometry of the substrate being processed, the volume capacity of the plasma cavity, the volume capacity of the chamber body, as well as the capabilities of the vacuum system coupled to the chamber body.

As the plasma is generated remotely in the remote plasma source 204, the etchants dissociated from the removal gas mixture from the remote plasma is relatively mild and gentle, so as to slowly, gently and gradually chemically react the treated regions, such as the top surface 424 and the bottom surface 425, until patterned structure 408 and the dielectric layer 404 are exposed, as shown in FIG. 4D. It is believed that in the remote plasma source, ammonia ($NH_3$) gas and the nitrogen trifluoride ($NF_3$) gas are dissociated in the remote plasma source 204, forming ammonium fluoride ($NH_4F$) and/or ammonium fluoride with HF ($NH_4F.HF$). Once the etchants of ammonium fluoride ($NH_4F$) and ammonium fluoride with HF ($NH_4F.HF$) are introduced into the interior processing region 251 of the processing chamber 202, the etchants of ammonium fluoride ($NH_4F$) and ammonium fluoride with HF ($NH_4F.HF$) may react with the treated regions, such as the top surface 424 and the bottom surface 425, upon reaching the substrate, forming $NH_4$ containing salt, to be removed from the substrate 402. The etchants of ammonium fluoride ($NH_4F$) and ammonium fluoride with HF ($NH_4F.HF$) chemically react treated regions, such as the top surface 424 and the bottom surface 425, forming $NH_4$ containing salt in gas state pumping out of the processing chamber, or in solid state, which will be later removed from the substrate surface by using a low temperature sublimation process.

In one or more embodiments, the gases added to provide the removal gas mixture having at least a 1:1 molar ratio of ammonia ($NH_3$) to nitrogen trifluoride ($NF_3$). In one or more embodiments, the molar ratio of the removal gas mixture is at least about 3:1 (ammonia to nitrogen trifluoride). The gases are introduced in the processing chamber 202 at a molar ratio of about 5:1 (ammonia to nitrogen trifluoride) to about 20:1. In yet another embodiment, the molar ratio of the etching gas mixture is about 5:1 (ammonia to nitrogen trifluoride) to about 10:1.

In one embodiment, other types of gas, such as inert gas or carrier gas, may also be supplied in the removal gas mixture to assist carrying the removal gas mixture into the interior processing region 251 of the processing chamber 202. Suitable examples of the inert gas or carrier gas include at least one of Ar, He, $N_2$, $H_2$, $O_2$, $N_2O$, $NO_2$, NO, and the like. In one embodiment, the inert or carrier gas may be supplied into the processing chamber 202 is Ar or He and $H_2$ or $N_2$ at a volumetric flow rate of between about 500 sccm and about 2000 sccm.

While supplying the removal gas mixture to perform the remote plasma source etching/removal process, a substrate temperature may be maintained at a range of between about 40 degrees Celsius and about 150 degrees Celsius, such as about 100 degrees Celsius. It is noted that the relatively low temperature of around 100 degrees Celsius, compared to the high temperature, e.g., about 350 degrees Celsius, at the pretreatment process, deposition process at operation 304 and the post-deposition treatment process at operation 306, may assist stabilizing the treated region removal process performed in a steady manner so that the treated region may be removed in a mild/gentle manner without attacking or damaging the un-treated region so as to enable a successful selective removal process.

After the removal gas mixture is supplied into the processing chamber, the treated regions, such as the top surface 424 and the bottom surface 425, may be then etched and removed, leaving solid etching byproduct, such as an ammonium salt, on the substrate surface, if any. The etching byproduct, such as an ammonium salt, remaining on the substrate 402 has a relatively low melting point, such as about 100 degrees Celsius, which allows the byproduct to be removed from the substrate by a sublimation process performed after the selective removal process at operation 308. The sublimation process may be the same as the pretreatment process discussed above prior to performing the deposition process at operation 304. As the deposition process at operation 304, the post-deposition process at operation 306 and the selective removal process at operation 308 may be repeatedly performed, as indicated by the loop 310 shown in FIG. 3, as many times as needed, the sublimation process utilized to removal the etching byproduct at operation 308 may be the pretreatment process performed prior to the deposition process at operation 304 as discussed above. In one embodiment, the number of cycles in which operation 304 to operation 308 are performed may be about 2 to about 10 times.

During the etching/removal process at operation 308, several process parameters may be regulated to control the etching/removal process. In one exemplary embodiment, a process pressure in the processing chamber 202 is regulated to between about 500 mTorr to about 5000 mTorr, such as about 1500 mTorr. A RPS at a frequency of about 70 KHz may be applied to supply a remote plasma. For example, a RPS power of about 20 Watts to about 60 Watts, such as about 40 Watts, may be applied to the etching gas mixture.

Figure 4E:
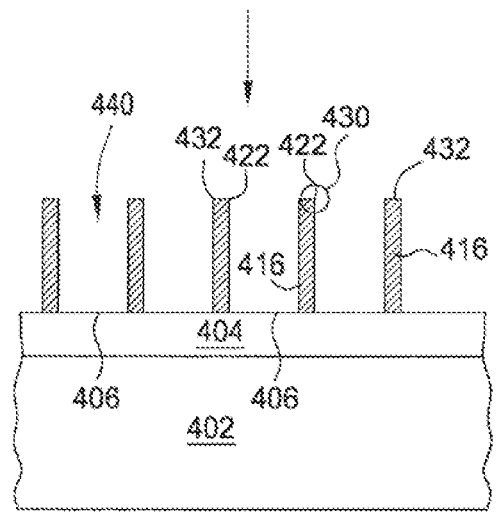

After the spacer layer 416 with a desired profile is formed on the substrate 402, a post etching process may then be performed to remove the patterned structure 408 from the substrate 402, as shown in FIG. 4E, leaving the spacer layer 416 with reduced dimension openings 440 (e.g., a second group of openings) defined therebetween as an etching mask for the following manufacturing process. The post etching gas mixture may be performed to selectively and predominately etching the patterned structure 408 substantially without etching or damaging the spacer layer 416.

It is noted that the pretreatment process, the deposition process at operation 304, the post-deposition treatment process at operation 306, the selective removal process at operation 308 and the optional post etching process performed to remove the patterned structure 408 after the selective removal process may all be performed in the same processing chamber (e.g., in-situ).

Thus, embodiments of pattering a spacer layer for performing a multi-patterning process are provided to produce a patterned spacer layer with desired edge/corner profile. By utilizing a pre-treatment process, a deposition process, a post-deposition treatment process, and a selective etching process during the spacer layer deposition and patterning process, a controlled ion trajectory/directionality may be obtained so as to pattern the spacer layer in a desired manner that yields a patterned spacer layer with desired accurate and right angle corners and vertical sidewall profile.

While the foregoing is directed to embodiments of the present invention, other and further embodiments of the invention may be devised without departing from the basic scope thereof, and the scope thereof is determined by the claims that follow:

What is claimed is:

1. A method for depositing and patterning a spacer layer during a multiple patterning process, comprising:
   conformally forming a spacer layer on an outer surface of a patterned structure disposed on a substrate, wherein the patterned structure has a first group of openings defined therebetween;
   selectively treating a first portion of the spacer layer formed on the substrate without treating a second portion of the spacer layer, wherein the selectively treating the first portion of the spacer layer further comprises supplying a post-deposition treatment gas mixture including an inert gas to the substrate, and applying an RF bias power of between 250 Watts and about 1500 Watts without a RF source power to the post-deposition treatment gas mixture; and
   selectively removing the treated first portion of the spacer layer.

2. The method of claim 1, wherein the patterned structure comprises an amorphous carbon material, silicon nitride, silicon dioxide or silicon carbide.

3. The method of claim 1, wherein the spacer layer comprises a polysilicon or an amorphous silicon.

4. The method of claim 1, wherein selectively treating the first portion of the spacer layer further comprises:
   selectively treating a top surface and a bottom surface of the spacer layer without treating sidewalls and corners of the spacer layer.

5. The method of claim 1, wherein conformally forming the spacer layer further comprises:
   supplying a deposition gas mixture including a silicon-based gas and $N_2$ gas.

6. The method of claim 5, wherein supplying the deposition gas mixture further comprises:
   applying an inductive coupled source power of less than 6500 Watts to the gas mixture; and
   applying an RF bias power of between 100 Watts and about 500 Watts to the gas mixture.

7. The method of claim 1, wherein selectively removing the treated first portion of the spacer layer further comprises:
   supplying a selective removal gas mixture including an ammonia ($NH_3$) gas and an nitrogen trifluoride ($NF_3$) gas; and
   applying a remote plasma source to the gas mixture to the substrate.

8. The method of claim 7, wherein the selective removal gas mixture further comprises an inert gas.

9. The method of claim 1 further comprising:
   removing the patterned structure from the substrate.

10. The method of claim 9 further comprising:
    forming a second group of openings in the etched spacer layer with a dimension less than that of the first group of openings.

11. The method of claim 1, further comprising:
    pretreating the substrate prior to conformally forming a spacer layer on the substrate.

12. The method of claim 11, wherein pretreating the substrate further comprises:
    supplying a pretreatment gas mixture including an inert gas to the substrate; and
    maintaining the substrate temperature between about 200 degrees and about 400 degrees Celsius.

13. The method of claim 12 further comprising:
    applying a top inductive coupled source power at about 2000 Watts and a side inductive coupled source power at about 4000 Watts.

14. The method of claim 1, wherein selectively removing the treated first portion of the spacer layer further comprises
    predominately etching the first portion of the spacer layer including a top surface and a bottom surface of the spacer layer without substantially attacking the second portion including the sidewalls and corners of the spacer layer.

15. The method of claim 14, wherein the pretreatment process, the conformally depositing process, the selective treating process and the selective removing process are all performed in a single processing chamber.

16. The method of claim 15, wherein the spacer layer comprises a polysilicon or an amorphous silicon.

17. A method for depositing and patterning a spacer layer during a multiple patterning process, comprising:
- performing a pre-treating process on a substrate provided in a processing chamber;
- performing a spacer layer deposition process to form a spacer layer on the substrate by using an inductive coupled plasma during the deposition process;
- performing a post-deposition treatment process to selective treat a portion of the spacer layer by using a RF bias power of between 250 Watts and about 1500 Watts without the inductive coupled plasma during the post-deposition treatment process; and
- performing a selective removal process to selective remove the portion of the spacer layer by a remote plasma source during the selective removal process.

18. A method for depositing and patterning a spacer layer disposed on a substrate, comprising:
- supplying a deposition gas mixture including a silicon-based gas and a nitrogen into a processing chamber to depositing a spacer layer on a substrate using an inductive coupled plasma formed in the deposition gas mixture;
- supplying a post-deposition treatment gas mixture including an inert gas to selective treat a first portion of the spacer layer disposed on the substrate without treating a second portion of the spacer layer, wherein selective treating the first portion of the spacer layer further comprises applying an RF bias power of between 250 Watts and about 1500 Watts without a RF source power to the post-deposition treatment gas mixture; and
- supplying a selective removal gas mixture to remove only the treated first portion of the spacer layer from the substrate using a remote plasma source formed from the selective removal gas mixture.

* * * * *